(12) United States Patent
Eun

(10) Patent No.: US 7,910,480 B2
(45) Date of Patent: Mar. 22, 2011

(54) METHOD FOR INSULATING WIRES OF SEMICONDUCTOR DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 133 days.

(21) Appl. No.: 12/491,883

(22) Filed: Jun. 25, 2009

(65) Prior Publication Data

US 2010/0167539 A1 Jul. 1, 2010

(30) Foreign Application Priority Data

Dec. 26, 2008 (KR) .................. 10-2008-0134833

(51) Int. Cl.
*H01L 21/768* (2006.01)
(52) U.S. Cl. .................. 438/672; 257/E21.585
(58) Field of Classification Search .................. 438/670, 438/671, 672; 257/E21.585
See application file for complete search history.

(56) References Cited

U.S. PATENT DOCUMENTS

| 6,333,219 B1 * | 12/2001 | Park et al. ............... 438/238 |
| 2009/0004839 A1 * | 1/2009 | Eun ............................. 438/597 |

FOREIGN PATENT DOCUMENTS

| KR | 10-2008-0055162 | 6/2008 |
| KR | 10-0875656 | 12/2008 |

* cited by examiner

*Primary Examiner* — W. David Coleman
(74) *Attorney, Agent, or Firm* — Marshall, Gerstein & Borun LLP

(57) ABSTRACT

Disclosed herein is a method for insulating wires of a semiconductor device. One embodiment of the method includes forming first bit line stacks over a cell region of a semiconductor substrate and second bit line stacks over a peripheral region of the semiconductor substrate, and forming a Spin On Dielectric (SOD) layer to fill between the first and second bit line stacks. The method also includes etching back the SOD layer to expose upper side portions of the first and second bit line stacks, selectively removing a portion of the SOD layer present on the peripheral region, and depositing a High Density Plasma (HDP) insulation layer to cover a portion of the SOD layer present on the cell region, and to fill between the second bit line stacks present on the peripheral region.

11 Claims, 7 Drawing Sheets

METHOD FOR INSULATING WIRES OF SEMICONDUCTOR DEVICE

CROSS-REFERENCE TO RELATED APPLICATION

Priority to Korean patent application No. 10-2008-0134833, filed on Dec. 26, 2008, the disclosure of which is incorporated herein by reference in its entirety, is claimed.

BACKGROUND OF THE INVENTION

1. Field of the Invention

The invention generally relates to a semiconductor device, and more particularly, to a method for insulating wires of a semiconductor device.

2. Background of the Invention

With increase in an integration degree of semiconductor devices, a design rule of circuit wires such as a bit line has been sharply decreased. For example, as a design rule of a Dynamic Random Access Memory (DRAM) device is decreased to below 40 nm and a design rule of 34 nm is required, a method for filling a gap between bit lines to effectively insulate the bit lines is required. Because a critical dimension of the bit line has been sharply decreased, it becomes difficult for an interlayer insulation layer to effectively fill the gap between the bit lines.

To form the interlayer insulation layer, a process of depositing High Density Plasma (HDP) insulation between the bit lines has been used. However, as an aspect ratio of the gap between the bit lines is increased with decrease in the design rule, it becomes difficult to effectively fill between the bit lines with a HDP insulation layer. Moreover, in a DRAM device, the aspect ratio of the gap between the bit lines has been greatly enlarged as a capping layer introduced above the bit line is gradually thickened and a spacer is introduced on a side wall of the bit line. This capping layer is required to be formed with larger thickness because it is used as an etch barrier in a subsequent process of forming a self aligned contact hole. As the aspect ratio of the gap between the bit lines is increased as such, it becomes more difficult to fill between the bit lines with the HDP insulation layer. Therefore, it is required to develop a method of forming an interlayer insulation layer which fills and insulates between the bit lines more effectively.

SUMMARY OF THE INVENTION

Embodiments of the present invention are directed to a semiconductor device manufacturing method, wherein the method fills a narrow gap between wires, such as a bit line of a semiconductor device, to insulate the bit line effectively and reliably.

In one embodiment, a method for insulating wires of a semiconductor device includes forming first bit line stacks over a cell region of a semiconductor substrate and second bit line stacks over a peripheral region of the semiconductor substrate. The method includes forming a spacer layer that covers the first and second bit line stacks, forming a first mask that selectively exposes a portion of the spacer layer present on the cell region, etching the exposed portion of the spacer layer to leave the other portion of the spacer layer present on the peripheral region as an etch stop layer, and selectively attaching a spacer to a side wall of the first bit line stack. The method also includes forming a first insulation layer of a flowable insulation material that fills between the first and second bit line stacks, etching back the first insulation layer to expose upper side portions of the first and second bit line stacks, selectively removing a portion of the first insulation layer present on the peripheral region, and forming a second insulation layer denser than the first insulation layer to cover a portion of the first insulation layer present on the cell region, and to fill the second bit line stacks present on the peripheral region.

In another embodiment, a method for insulating wires of a semiconductor device includes forming first bit line stacks over a cell region of a semiconductor substrate and second bit line stacks over a peripheral region of the semiconductor substrate. The method includes forming a Spin On Dielectric (SOD) layer to fill between the first and second bit line stacks, etching back the SOD layer to expose upper side portions of the first and second bit line stacks, selectively removing a portion of the SOD layer, and depositing a High Density Plasma (HDP) insulation layer to cover a portion of the SOD layer present on the cell region and to fill between the second bit line stacks present on the peripheral region.

The forming of the first and second bit line stacks preferably includes forming a lower insulation layer over the semiconductor substrate; sequentially depositing a bit line conductive layer and a capping layer over the lower insulation layer; patterning the bit line conductive layer and the capping layer to form the first and second bit line stacks; forming a spacer layer to cover the first and second bit line stacks; forming a first mask that selectively exposes a portion of the spacer layer present on the cell region; and, etching the exposed portion of the spacer layer to leave the other portion of the spacer layer present on the peripheral region as an etch stop layer and selectively attaching a spacer to a side wall of the first bit line stack.

The method may further include forming a barrier metal layer between the bit line conductive layer and the lower insulation layer.

The selective removal of the portion of the SOD layer preferably includes forming a second mask that exposes the portion of the SOD layer present on the peripheral region, and etching the portion of the SOD layer exposed by the second mask to expose the etch stop layer.

In further another embodiment, a method for insulating wires of a semiconductor device includes forming a lower insulation layer, and sequentially depositing over the lower insulation layer a bit line conductive layer and a capping layer. The method also includes patterning the bit line conductive layer and the capping layer to form first and second bit line stacks, wherein the first bit line stacks has Critical Dimension (CD) and space less than that of the second bit line stacks, forming a spacer layer to cover the first and second bit line stacks, and selectively etching a portion of a spacer layer covering the first bit line stacks to leave the other portion of the spacer layer covering the second bit line stacks as an etch stop layer, and selectively attaching a spacer to a side wall of the first bit line stack. The method also includes forming a SOD layer to fill between the first and second bit line stacks, etching back the SOD layer to expose upper side portions of the first and second bit line stacks, selectively etching the portion of the SOD layer present between the second bit line stacks to expose the etch stop layer. Furthermore, the method includes depositing a HDP insulation layer to cover the unetched portion of the SOD layer and to fill between the second bit line stacks, forming a metal contact that penetrates the HDP insulation layer to be aligned with the second bit line stack, and forming a metal wire that is electrically connected to the metal contact.

The forming of the SOD layer preferably includes coating polysilazane to cover the bit line stacks, curing the coated polysilazane layer in an atmosphere of hydrogen gas and oxygen gas, performing Chemical Mechanical Polishing (CMP) to planaraize the cured polysilazane layer.

The etching back of the SOD layer preferably includes wet etching the SOD layer with diluted hydrofluoric acid (HF).

The forming of the metal contact preferably includes forming a contact hole that penetrates the HDP insulation layer, and the capping layer of the second bit line stack to expose the bit line conductive layer, and depositing by CVD a tungsten layer that fills the contact hole.

As described above, embodiments of the present invention can provide a method which effectively fills a narrow gap between wires such as a bit line of a semiconductor device to insulate the bit line effectively and reliably.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
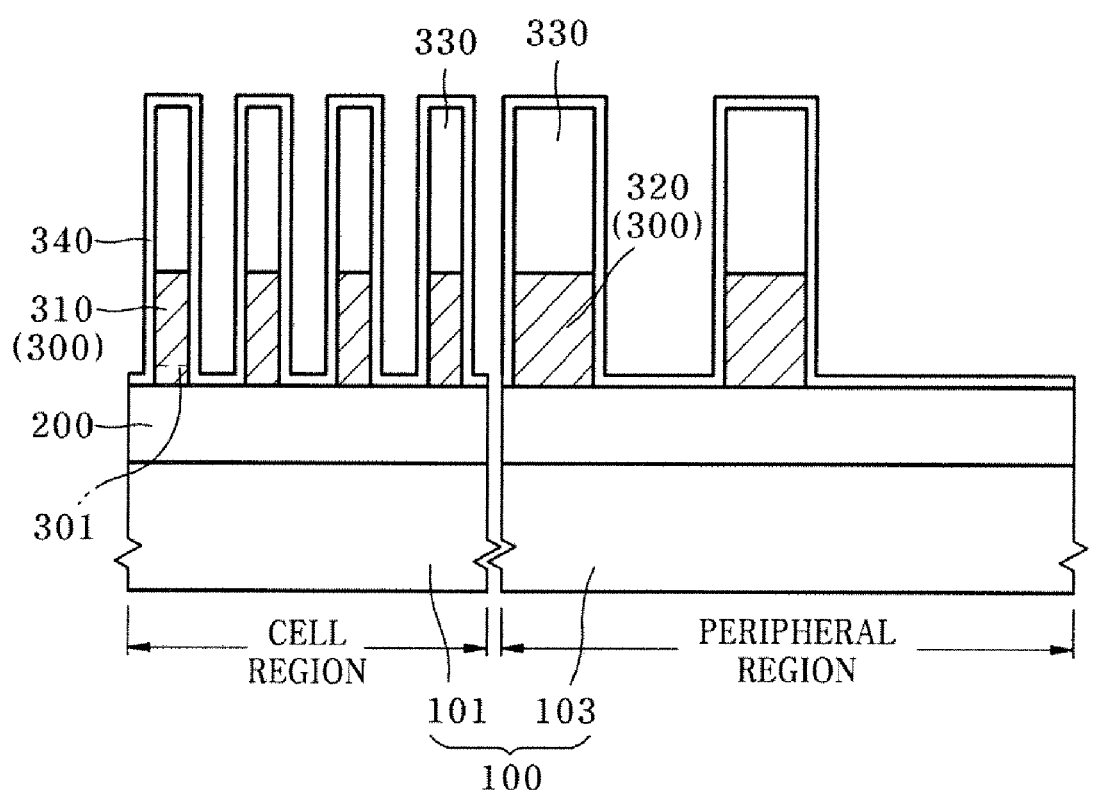
FIGS. 1 through 7 are cross-sectional views illustrating a method for insulating wires of a semiconductor device in accordance with an embodiment of the present invention.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DESCRIPTION OF SPECIFIC EMBODIMENTS

A preferred embodiment provides a method for filling and insulating a space between wires, such as a bit line, with a flowable insulation layer, such as a Spin On Dielectric (SOD) layer when a design rule is decreased to about 34 nm and, thus, the space between the wires is narrowed. The SOD layer is formed by coating a SOD chemical over a semiconductor substrate by spin coating, exhausting a solvent from the coated layer, and then curing the coated layer to oxidate the layer into silicon oxide ($SiO_2$). This SOD layer can be formed of polysilazane based material. This polysilazane layer requires a relatively low curing temperature to oxidate into silicon oxide. The polysilazane layer has relatively restricted generation of an internal void upon curing, unlike a Spin On Glass (SOG) layer, such as hydrodilsesquioxane. Therefore, it is possible to avoid formation of an internal void and extreme contraction common when SOG is cured.

Although this SOD layer (using polysilazane) can be introduced to sufficiently fill and insulate between bit lines in a semiconductor device of 30 nm scale, it has been experimentally reported that a crack is generated within the SOD layer when the SOD layer is accompanied with thermal budge by subsequent thermal process. In an embodiment of the present invention, to avoid generation of such a crack, the space between the stacks of the bit lines is partially filled with the SOD layer and then a layer of silicon oxide or a more dense insulation layer is deposited by High Density Plasma (HDP). The HDP insulation layer functions to firmly secure the SOD layer to avoid the generation of the crack within the SOD layer.

In an embodiment, it is possible to improve a gap filling property between the bit lines and restrict bending of the bit line at the same time by introducing a double layer structure of the SOD and HDP oxide layers. Also, because the SOD layer is coated by the spin coating, the SOD layer can be symmetrically grown at both sides of the bit line. Therefore, asymmetric deposition of the insulation layer accompanied in the growth of the insulation layer by the deposition can be avoided and it is thus possible to prevent bending of the bit line by the asymmetric deposition.

Meanwhile, in a semiconductor device such as a DRAM, a cell region in which transistors and capacitors constructing a memory cell are disposed is patterned with a relatively high density. Therefore, bit lines that detect data signal by the cell transistor are also disposed with relatively small CD and space in this cell region. In other words, the bit lines are disposed with a small pitch. On the contrary, in a peripheral region in which devices for driving the cell transistors or controlling operation of a circuit are disposed, the bit lines are extended with relatively large CD and space. The bit line extended on the peripheral region is connected to a metal contact, and this metal contact is electrically connected to a metal wire formed in an upper portion of the bit line.

This metal contact is formed penetrating an insulation layer that insulates the bit lines in the peripheral region. At this time, when the SOD layer is included in the insulation layer, deposition of tungsten in a process of forming the metal contact is made more difficult. When the SOD layer is exposed to the tungsten deposition process, out-gassing of gas or organic steam obstructing the deposition from the SOD layer can be observed. Because this out-gassing obstructs the deposition of the tungsten, the tungsten cannot be deposited in an interface between the metal contact and the bit line and, thus, a vacancy results. In an embodiment, in order to restrict poor deposition of the metal contact or poor filling of the metal contact hole due to the introduction of the SOD layer, a process of selectively removing the portion of the SOD layer deposited over the peripheral region is introduced. Because the SOD layer is selectively removed from the peripheral region and the HDP insulation layer is then deposited to cover a portion of the SOD layer present on the cell region, the HDP insulation layer is placed around the metal contact. Therefore, it is possible to restrict the poor deposition by the out-gassing from the SOD layer upon forming the metal contact.

By avoiding the introduction of the SOD layer into the peripheral region, lift-off of the insulation layer in the peripheral region can be restricted. Patterns disposed in the peripheral region, e.g. the bit lines can be spaced apart from each other and these patterns can be disposed as an isolated pattern. Therefore, the SOD layer can be coated to occupy a wide area. However, when this wide area is occupied only by the SOD layer, it is observed that the SOD layer is lifted-off or peeled-off as a planar phase in this portion due to weak strength of the SOD layer itself. In an embodiment, it is possible to fundamentally prevent the lift-off or the peel-off the SOD layer by avoiding the SOD layer in the peripheral region.

FIGS. 1 through 7 are cross-sectional views illustrating a method for insulating wires of a semiconductor device in accordance with an embodiment.

Referring to FIG. 1, a stack of a bit line 300 and a capping layer 330 is formed over a semiconductor substrate 100 including a cell region 101 and a peripheral region 103. A lower insulation layer 200 is formed over the semiconductor substrate 100 and a bit line conductive layer, e.g. a tungsten layer, for the bit line 300 is directly deposited over the lower insulation layer 200. Although a barrier metal layer 301 such as a titanium nitride layer or an adhesive layer may be introduced over the tungsten layer and the lower insulation layer 200, this barrier metal layer 301 can be eliminated because the tungsten layer is formed by Physical Vapor Deposition (PVD). The tungsten layer can be connected to a transistor (not shown) therebelow realized over the semiconductor substrate 100 by a connection contact (not shown) that penetrates the lower insulation layer 200. This connection contact can be formed of a tungsten layer deposited by Chemical Vapor Deposition (CVD).

An insulation material, such as silicon nitride ($Si_3N_4$) having an etch selectivity to silicon oxide ($SiO_2$) which forms an interlayer insulation layer in a subsequent process is deposited over the bit line conductive layer, thereby depositing the capping layer 330. The capping layer 330 can be formed with a thickness sufficiently high to function as an etch barrier to resist against etching when a storage node contact is formed. The storage node contact is connected to a storage node (not shown) of a capacitor, which is designed so as to be placed above the bit line 300. The storage node contact is formed in a line type Self Aligned Contact (SAC). The capping layer 330 for protecting the bit line 300 is introduced with a relatively thin thickness in a hole type SAC. In contrast, a capping layer 330 having a quite thick thickness is required in a line type SAC. In a line type SAC, a contact hole is formed in a line shape crossing a plurality of the bit lines 300. An etched amount of the capping layer 330 is relatively large and an amount polished by subsequent Chemical Mechanical Polishing (CMP) is also relatively large.

In an embodiment, when the bit line 300 is formed of a tungsten layer having a thickness of about 500 Å, the capping layer 330 which functions as a hard mask can be formed with a thickness of one to three times the thickness of the bit line 300. For example, the capping layer 330 can be formed with a thickness of 500 to 1100 Å.

The capping layer 330 is deposited over the bit line 300 and then patterned by a selective etching process to form stacks of a first bit line 310 and capping layer 330 over the cell region 101 and stacks of a second bit line 320 and the capping layer 330. A first CD of the stack of the first bit line 310 and capping layer 330 and a first space between adjacent stacks of the first bit line 310 and capping layer 330 are narrower than a second CD of the stack of the second bit line 320 and capping layer 330 and a second space between adjacent stacks of the second bit line 320 and capping layer 330, respectively. The second CD of the second bit line 320 is relatively large to ensure a contact margin of a metal contact because a subsequent metal contact is aligned and connected to the second bit line 320.

After the stacks of the first bit line 310 and the second bit line 320 are patterned, a spacer layer 340, covering the bit line 300 and the capping layer 330, is formed. The spacer layer 340 can include silicon nitride. For example, the silicon nitride can be deposited at a temperature of about 710° C., after providing silane ($SiH_4$) and ammonia ($NH_3$) at 15 sccm and 6000 sccm, respectively, and controlling the pressure of a process furnace at 300 Torr. The deposited layer of the silicon nitride has a thickness of 150 to 250 Å by this low pressure deposition.

Figure 2:
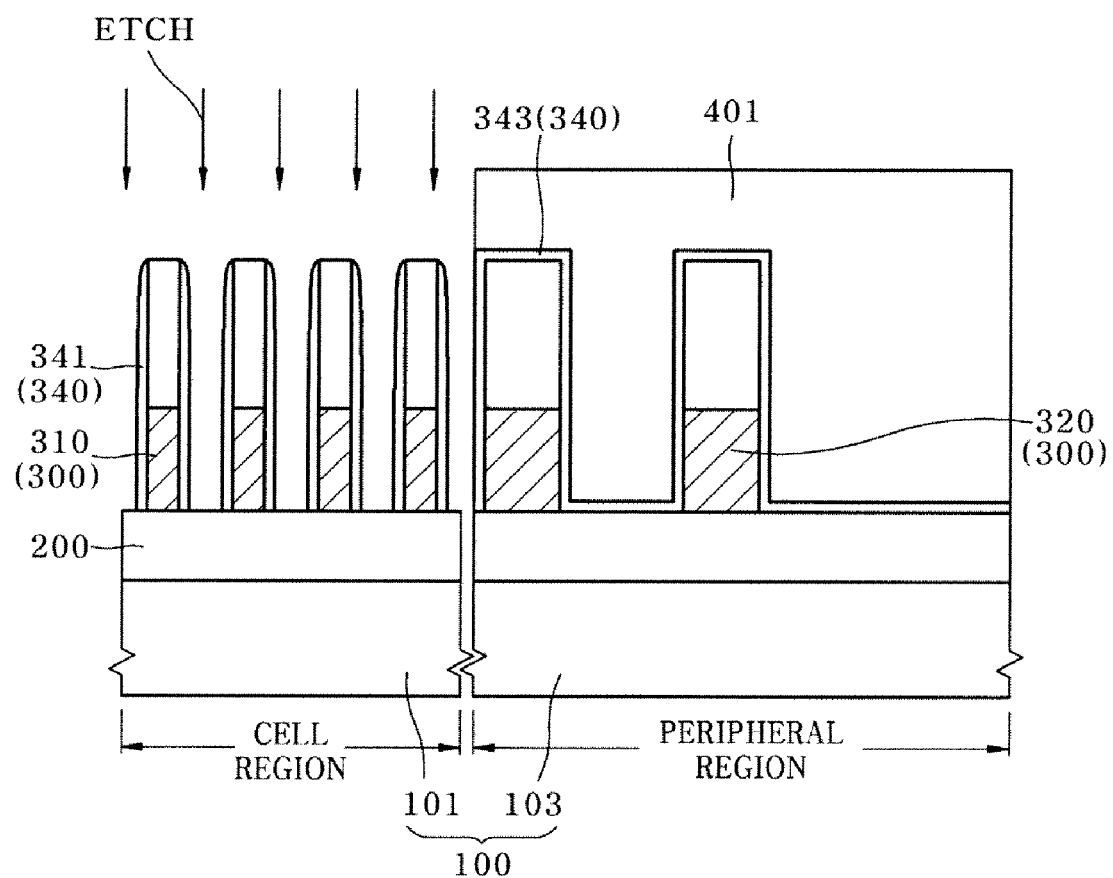

Referring to FIG. 2, a first mask 401 is formed and selectively exposes a portion of the spacer layer 340 placed in the cell region 101. The portion of the spacer layer 340 exposed by the first mask 401 is selectively etched to form a spacer 341 attached to a side wall of the stack of the first bit line 310 and the capping layer 330. The etching process preferably is carried out in a dry etching process using a fluorocarbon based etching gas, such as tetrafluoride carbon ($CF_4$). The first mask 401 can be formed by coating a photoresist and then exposing and developing the photoresist. The other portion of the spacer layer 340 left in this process of forming the spacer 341, i.e. the portion of the spacer layer 340 placed over the peripheral region 103 is left as an etch stop layer 343. After that, the first mask 401 is selectively removed.

Figure 3:
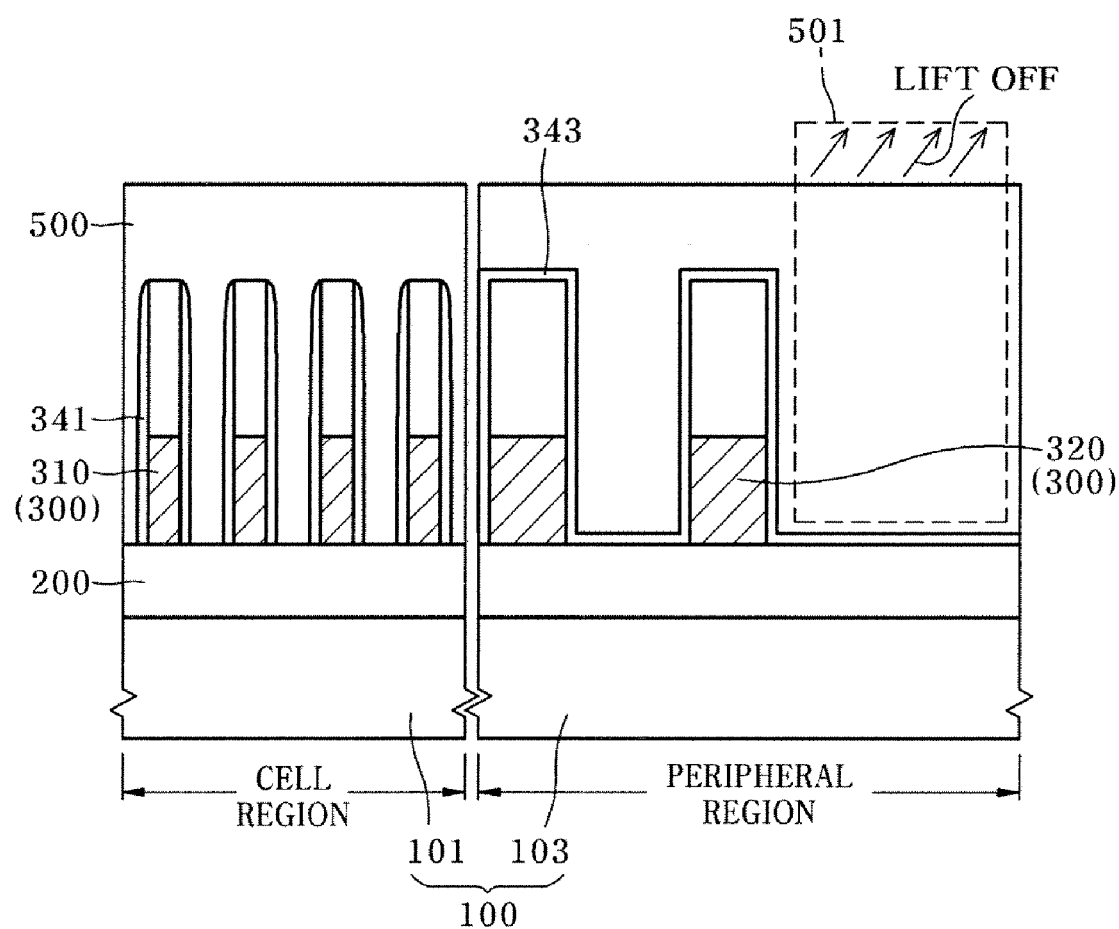

Referring to FIG. 3, a Spin On Dielectric (SOD) layer 500 is formed to fill void/vacancies between the stacks of the bit line 300. An SOD chemical such as polysilazane is coated over the semiconductor substrate 100 by spin coating and maintained on a hot chuck at about 150° C. for about 180 seconds to volatilize solvent from the coated layer. After that, the coated polysilazane layer is cured by providing an oxidation atmosphere thereto and thus oxidated into silicon oxide to form the SOD layer 500. In order to provide the oxidation atmosphere, hydrogen gas ($H_2$) and oxygen gas ($O_2$) are provided in a volume ratio of 1 L:2 L. The curing is carried out for about one hour at a temperature of about 500° C. By this curing process, the polysilazane coated layer is oxidated and converted into a layer of silicon oxide.

Because the SOD layer 500 is formed by coating a chemical such as liquid polysilazane, it is possible to effectively fill and insulate the narrow gap between the first bit lines 310. Because the SOD layer 500 is formed by coating, asymmetric deposition, which is accompanied upon deposition of HDP oxide, can be avoided. That is to say, growth amount of the SOD layer 500 at both sides of the first bit line 310 is equal and thus symmetric growth or coating can be performed. Therefore, it is possible to fundamentally prevent the first bit line 310 from being bended by the asymmetric deposition.

The SOD layer 500 deposited over the peripheral region 103 can be formed so as to occupy a wider area than in the cell region 101. That is to say, the SOD layer 500 can fill and occupy an isolated region with no second bit line 320. The portion of the SOD layer 500 where lower patterns are placed in the wide area is excessively contracted or deformed by subsequent thermal process and a phenomenon that such portion is lifted off or peeled off as a planar defect 501 is experimentally observed. To restrict this planar defect 501, in an embodiment, the portion of the SOD layer 500, which can result in this planar defect 501 is selectively removed in a subsequent process.

Figure 4:
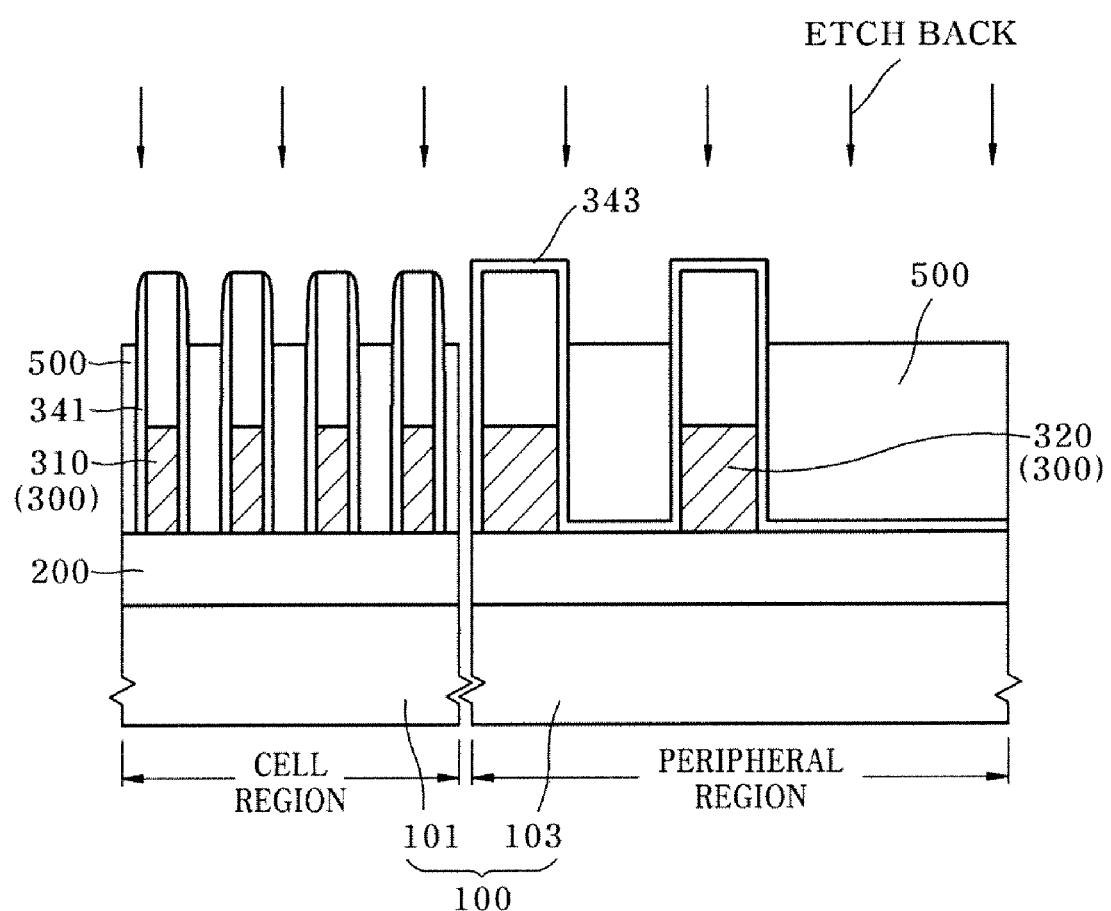

Referring to FIG. 4, the SOD layer 500 is recessed by an etch back process so that the side walls of the bit lines 300 are exposed. The etch back process can be carried out in a wet etch process using a hydrofluoric acid (HF) etchant diluted in pure water to about 100:1. Prior to carrying out the wet etch process, a process of planarizing the SOD layer (500 in FIG. 3) by CMP is carried out to ensure the SOD layer 500 is uniformly recessed. The wet etch process is carried out to remove a thickness of about 1000 Å so that a concaved portion is formed between the bit lines 300.

Figure 5:
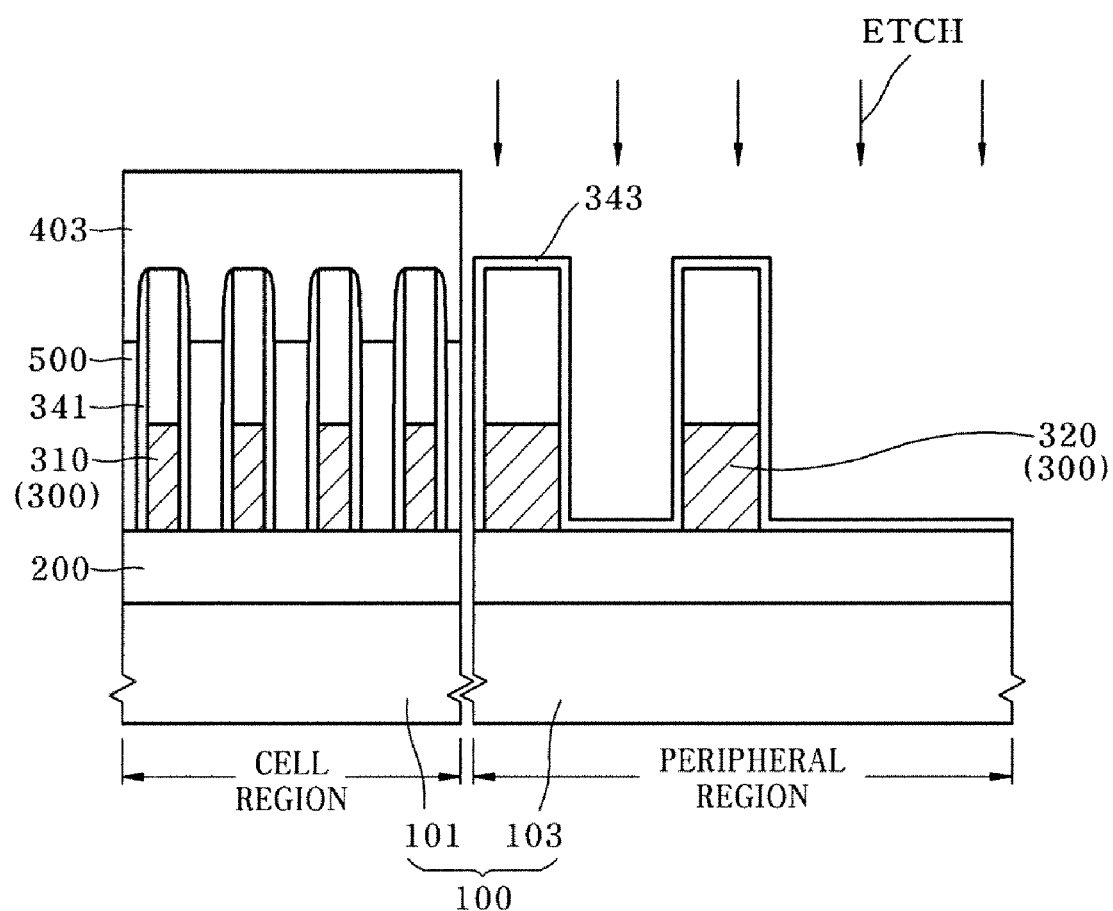

Referring to FIG. 5, a second mask 403, which opens the peripheral region 103, is formed with inclusion of a photoresist pattern over the SDO layer 500 recessed by the etch back. The portion of the SOD layer 500 exposed over the peripheral region 103 is selectively etched to be removed. The portion of the SOD layer 500 over the cell region 101 is not etched because it is protected/masked by the second mask 401. This etch process is carried out until the surface of the etch stop layer 343 below is exposed to substantially remove the SOD layer 500 from the peripheral region 103. The etch stop layer 343 protects the lower insulation layer 200 and prevents damage to the insulation reliability. This etch process can be carried out using a HF solution diluted in water to about 100:1. After that, the second mask 403 is selectively removed.

Figure 6:
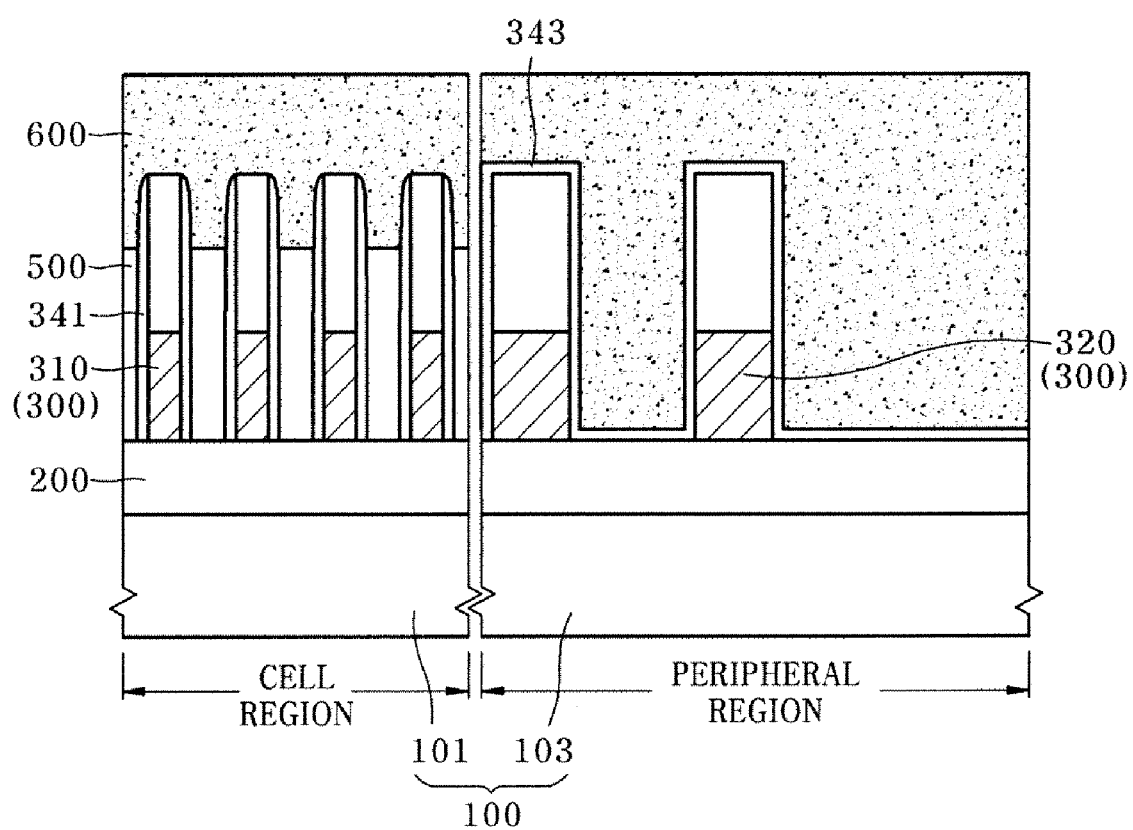

Referring to FIG. 6, an interlayer insulation layer is formed, and covers the portion of the SOD layer 500 left between the stacks of the first bit line 310, fills voids/vacancies between the first bit lines 310, covers the portion of the etch stop layer 343 exposed over the peripheral region 103, and fills voids/vacancies between the second bit lines 320. The interlayer insulation layer is formed of an insulation layer that is denser than the SOD layer 500 and, thus, has a hard layer property. The interlayer insulation layer also is formed of an insulation material in which out-gassing can be restricted in subsequent thermal process or metal contact deposition process. For example, an insulation layer 600 of silicon oxide by HDP deposition having superior gap filling property is formed as the interlayer insulation layer. The HDP insulation layer 600, because it has a layer property harder than that of the SOD layer 500, restricts excessive contraction of the SOD layer 500 that could occur in subsequent thermal processing or other processing and that could cause an internal crack. Also, the HDP insulation layer 600 functions to fill voids/vacancies and insulate between the second bit lines 320 in the peripheral region 103.

In the case of a semiconductor device of 30 nm design rule, the HDP insulation layer 600 can be used to fill voids/vacancies and insulate between the first bit lines 310 (with relatively narrow first space) and to fill voids/vacancies between the second bit lines 320 (with relatively wide second space). As such, the HDP insulation layer 600, which insulates the second bit lines 320 in the peripheral region 103, can restrict the undesired out-gassing that restricts deposition in a subsequent metal contact forming process. Because the process of depositing the HDP insulation layer 600 includes a plasma deposition process and, if necessary, accompanied with dry (or wet) etch and deposition processing after the deposition, it is possible to restrict the out-gassing source to be left therein.

Figure 7:
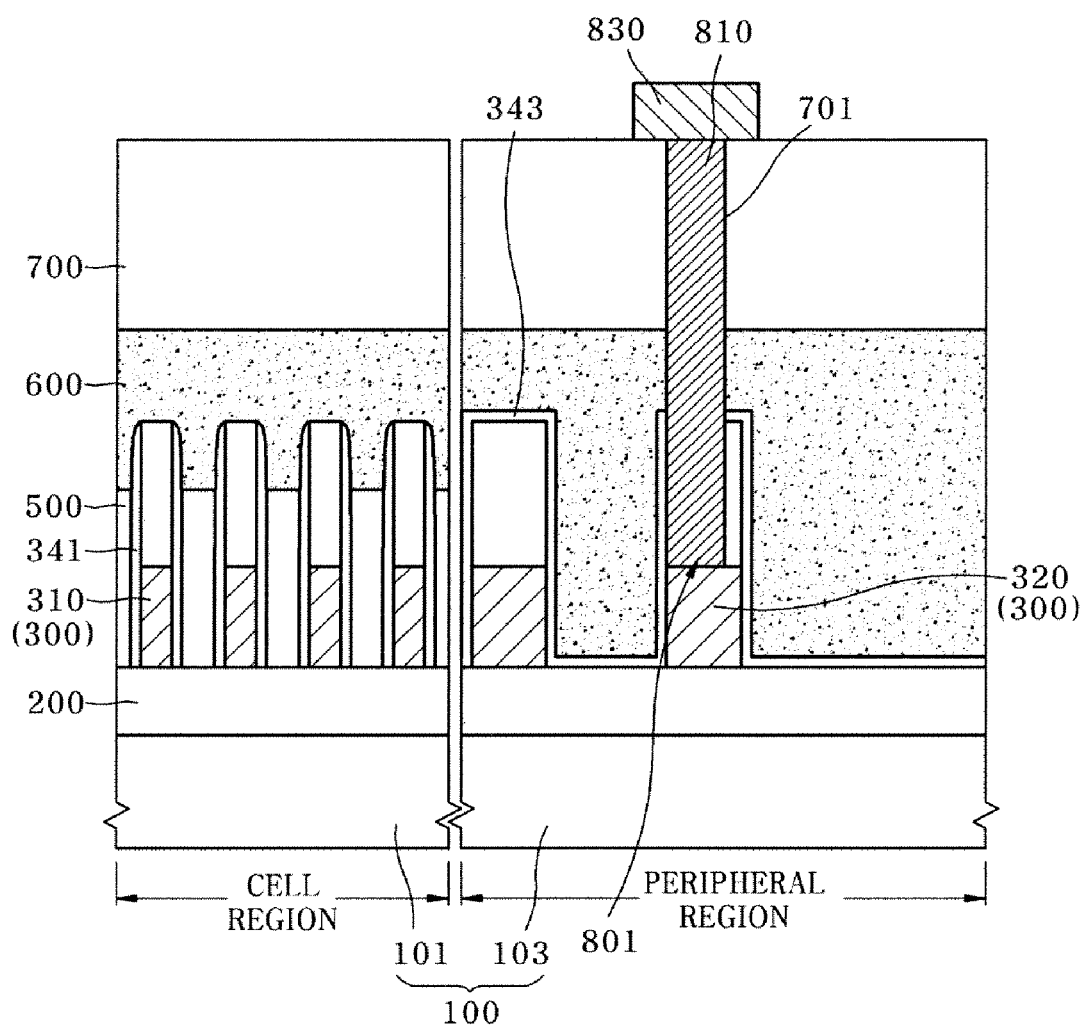

Referring to FIG. 7, an upper insulation layer 700 comprising silicon oxide is formed over the HDP insulation layer 600. A contact hole 701 is formed, and penetrates the upper insulation layer 700, the HDP insulation layer 600, and the capping layer 330 of the second bit line 320. After that, a layer (e.g. a tungsten layer) filling the contact hole 701 is deposited by CVD and followed by CMP to form a metal contact 810. A metal line 830, preferably including an aluminum layer, is formed and electrically connected onto the metal contact 810.

This metal contact 810 is introduced to apply an electric signal to the bit line 300 or draw out an electric signal from the bit line 300 to the outside. The contact hole 701 for this metal contact 810 is formed and aligned with the second bit line 320, but the HDP insulation layer 600 is exposed to or placed very close to the contact hole 701 by some misalignment according to process. The HDP insulation layer 600 substantially includes no out-gassing source and, thus, out-gassing from the SOD layer 500 into contact portion 801 is not substantially induced and restricted upon deposition of the tungsten layer filling the contact hole 701. On the contrary, when the SOD layer 500 is left in the position of the HDP insulation layer 600, the out-gassing can obstruct the deposition of the tungsten layer because the SOD layer 500 contains much out-gassing source therein.

In an embodiment of the present invention, because the HDP insulation layer 600 is disposed around the contact hole 701, it is possible to fundamentally prevent the out-gassing upon the deposition of the metal contact 810. Therefore, it is possible to restrict poor deposition of the tungsten layer or poor filling of the contact hole 701 due to the out-gassing, thereby increasing reliability of the electrical connection between the metal contact 810 and the second bit line 320.

The above embodiments of the invention are illustrative and not limitative. Throughout the specification, where methods and compositions are described as include steps or materials, it is contemplated that the methods and compositions can also consist essential of, or consist of, any combination of the recited steps or materials, unless described otherwise.

While the invention has been described with respect to the specific embodiments, it will be apparent to those skilled in the art that various changes and modifications may be made without departing from the spirit and scope of the invention as defined in the following claims.

What is claimed is:

1. A method for insulating wires of a semiconductor device, the method comprising:
   forming first bit line stacks over a cell region of a semiconductor substrate and second bit line stacks over a peripheral region of the semiconductor substrate;
   forming a Spin On Dielectric (SOD) layer to fill between the first and second bit line stacks;
   etching back the SOD layer to expose upper side portions of the first and second bit line stacks;
   selectively removing a portion of the SOD layer present on the peripheral region; and
   depositing a High Density Plasma (HDP) insulation layer to cover a portion of the SOD layer present on the cell region, and to fill between the second bit line stacks present on the peripheral region.

2. The method of claim 1, wherein the forming of the first and second bit line stacks comprises:
   forming a lower insulation layer over the semiconductor substrate;
   sequentially depositing a bit line conductive layer and a capping layer over the lower insulation layer;
   patterning the bit line conductive layer and the capping layer to form the first and second bit line stacks;
   forming a spacer layer to cover the first and second bit line stacks;
   forming a first mask that selectively exposes a portion of the spacer layer placed over the cell region; and
   etching the exposed portion of the spacer layer to leave the other portion of the spacer layer present on the peripheral region as an etch stop layer and selectively attaching a spacer to a side wall of the first bit line stack.

3. The method of claim 1, wherein the forming of the SOD layer comprises:
   coating polysilazane to cover the bit line stacks;
   curing the coated polysilazane layer in an atmosphere of hydrogen gas and oxygen gas; and
   performing Chemical Mechanical Polishing (CMP) to planarize the cured polysilazane layer.

4. The method of claim 1, wherein the etching back of the SOD layer comprises wet etching the SOD layer with diluted hydrofluoric acid (HF).

5. The method of claim 2, further comprising forming a barrier metal layer between the bit line conductive layer and the lower insulation layer.

6. The method of claim 2, wherein the selective removal of the portion of the SOD layer comprises:
   forming a second mask that exposes the portion of the SOD layer present on the peripheral region; and
   etching the portion of the SOD layer exposed by the second mask to expose the etch stop layer.

7. A method for insulating wires of a semiconductor device, the method comprising:
   forming first bit line stacks over a cell region of a semiconductor substrate and second bit line stacks over a peripheral region of the semiconductor substrate;
   forming a spacer layer to cover the first and second bit line stacks;
   forming a first mask that selectively exposes a portion of the spacer layer placed over the cell region;
   etching the exposed portion of the spacer layer to leave the other portion of the spacer layer present on the peripheral region as an etch stop layer and selectively attach a spacer to a side wall of the first bit line stack;

forming a first insulation layer of a flowable insulation material that fills between the first and second bit line stacks;

etching back the first insulation layer to expose upper side portions of the first and second bit line stacks;

selectively removing a portion of the first insulation layer present on the peripheral region; and forming a second insulation layer denser than the first insulation layer to cover a portion of the first insulation layer present on the cell region, and to fill the second bit line stacks present on the peripheral region.

8. The method of claim 7, wherein the first insulation layer comprises a polysilazane layer, and the second insulation layer comprises an HDP insulation layer.

9. A method for insulating wires of a semiconductor device, the method comprising:

forming a lower insulation layer;

sequentially depositing over the lower insulation layer a bit line conductive layer and a capping layer;

patterning the bit line conductive layer and the capping layer to form first and second bit line stacks, wherein the first bit line stacks has Critical Dimension (CD) and space less than that of the second bit line stacks;

forming a spacer layer to cover the first and second bit line stacks;

selectively etching a portion of a spacer layer covering the first bit line stacks to leave the other portion of the spacer layer covering the second bit line stacks as an etch stop layer, and selectively attach a spacer to a side wall of the first bit line stack;

forming a SOD layer to fill between the first and second bit line stacks;

etching back the SOD layer to expose upper side portions of the first and second bit line stacks;

selectively etching the portion of the SOD layer present between the second bit line stacks to expose the etch stop layer;

depositing a HDP insulation layer to cover the unetched portion of the SOD layer and to fill between the second bit line stacks;

forming a metal contact that penetrates the HDP insulation layer to be aligned with the second bit line stack; and forming a metal wire that is electrically connected to the metal contact.

10. The method of claim 9, wherein the forming of the SOD layer comprises:

coating polysilazane to cover the bit line stacks;

curing the coated polysilazane layer in an atmosphere of hydrogen gas and oxygen gas; and performing Chemical Mechanical Polishing (CMP) to planarize the cured polysilazane layer.

11. The method of claim 9, wherein the forming of the metal contact comprises:

forming a contact hole that penetrates the HDP insulation layer, and the capping layer of the second bit line stack to expose the bit line conductive layer; and depositing by Chemical Vapor Deposition a tungsten layer that fills the contact hole, by CVD.

* * * * *